(12) United States Patent
Ravi et al.

(10) Patent No.: US 9,611,565 B2
(45) Date of Patent: Apr. 4, 2017

(54) CRYSTAL GROWTH APPARATUS WITH CERAMIC COATING AND METHODS FOR PREVENTING MOLTEN MATERIAL BREACH IN A CRYSTAL GROWTH APPARATUS

(75) Inventors: Bhuvaragasamy G. Ravi, Nashua, NH (US); Parthasarathy S. Raghavan, Nashua, NH (US); Chandra P. Khattak, Nashua, NH (US); Carl Chartier, Manchester, NH (US); Dave Lackey, Merrimack, NH (US); Dean C. Skelton, Fitzwilliam, NH (US)

(73) Assignee: GTAT Corporation, Merrimack, NH (US)

( * ) Notice: Subject to any disclaimer, the term of this patent is extended or adjusted under 35 U.S.C. 154(b) by 1245 days.

(21) Appl. No.: 13/205,155

(22) Filed: Aug. 8, 2011

(65) Prior Publication Data

US 2012/0048179 A1 Mar. 1, 2012

Related U.S. Application Data

(60) Provisional application No. 61/377,306, filed on Aug. 26, 2010.

(51) Int. Cl.
| | |
|---|---|
| *C30B 35/00* | (2006.01) |
| *C30B 11/00* | (2006.01) |
| *C30B 29/06* | (2006.01) |

(52) U.S. Cl.
CPC .............. *C30B 11/00* (2013.01); *C30B 29/06* (2013.01); *C30B 35/00* (2013.01); *Y10T 117/1092* (2015.01)

(58) Field of Classification Search
USPC ................................ 117/81, 82, 83, 220, 221
See application file for complete search history.

(56) References Cited

U.S. PATENT DOCUMENTS

| | | | | |
|---|---|---|---|---|
| 5,766,346 | A * | 6/1998 | Hayashi et al. ............... | 117/208 |
| 2005/0126473 | A1 | 6/2005 | Prescott | |

(Continued)

FOREIGN PATENT DOCUMENTS

| | | |
|---|---|---|
| CN | 1656258 A | 8/2005 |
| CN | 201334536 Y | 10/2009 |

(Continued)

OTHER PUBLICATIONS

International Search Report mailed Oct. 5, 2011 in connection with related PCT International Application No. PCT/US2011/048779.

(Continued)

*Primary Examiner* — Robert M Kunemund
(74) *Attorney, Agent, or Firm* — Parker Ibrahim & Berg LLC; Stephen D. LeBarron

(57) ABSTRACT

A method for preventing molten material breach in a crystal growth apparatus includes providing a chamber of the crystal growth apparatus which is coated with a ceramic material. The chamber can be coated on an interior surface to prevent damage to the chamber itself, which is made of steel, and to prevent steam explosions in the water-cooled chamber. Ceramic blanket layers also can be provided over the coated interior surface of the chamber. As a result, it is possible to produce high quality crystalline products while minimizing the hazards and costs in the event of a spill of molten material.

21 Claims, 6 Drawing Sheets

(56) References Cited

U.S. PATENT DOCUMENTS

2010/0051108 A1    3/2010  Cliber et al.
2011/0097256 A1*  4/2011  Pizzini ......................... 423/349

FOREIGN PATENT DOCUMENTS

EP          1498515 A1    1/2005
WO     WO-02/40732 A1   5/2002
WO   WO-2010/005705 A1  1/2010

OTHER PUBLICATIONS

Taiwan Examination Report dated Apr. 8, 2015 issued in connection with TW 100130240.
Office Action dated Feb. 12, 2015 in connection with Chinese Application No. 201180041410.5.
Office Action dated Aug. 26, 2015 in connection with Chinese Application No. 201180041410.5.

* cited by examiner

CRYSTAL GROWTH APPARATUS WITH CERAMIC COATING AND METHODS FOR PREVENTING MOLTEN MATERIAL BREACH IN A CRYSTAL GROWTH APPARATUS

FIELD OF INVENTION

The subject invention is directed to crystal growth apparatuses with ceramic coatings. More particularly, the subject invention relates to methods for preventing molten material breach in a crystal growth apparatus.

DESCRIPTION OF THE RELATED ART

Directional solidification is one technique used to grow bulk crystalline materials such as silicon. Typically, feedstock material, such as silicon feedstock used for growth of silicon ingots, is supplied in chucks or blocks varying in size up to about four inches in diameter. During the growth process, the feedstock material is loaded into a fused silica crucible and the crucible is loaded into a crystal growth apparatus, such as a furnace. The feedstock material is then heated under controlled pressure and temperature to the point where the feedstock material becomes molten, typically above the melting point of silicon (1412° C.).

During the process of melting the feedstock material, an operator's view may be restricted to only a portion of the furnace and it is often difficult to monitor the volume of molten feedstock contained within the crucible. As a result, in the event of a leak of molten material, the operator has no feasible way to take action to stop the molten material from leaking out of the crucible. In the event that molten material having a temperature exceeding about 1425° C. escapes the confines of the crucible, it could cause significant damage to the crystal growth apparatus, including the possibility of major equipment loss and increased production time.

The materials and structure of the furnace also pose serious safety challenges. Conventionally, the furnace has a water jacket, or channel formed between the inner and outer walls, for containing heat within the chamber walls. The chamber walls are typically made of steel, which reacts with molten silicon forming eutectics at temperatures as low as about 650° C. When molten feedstock material breaches the inner wall of the water jacket surrounding the chamber, a steam explosion may occur, which can cause severe damage to the furnace and the surrounding facilities, as well as significant harm to operators and other personnel in close proximity.

Conventionally, to prevent molten material breach of the water jacket, a fiber blanket has been used. For example, an alumina-silica fiber blanket formed of one or more layers of insulation can be spread out on the inner surface of the chamber in the area beneath the crucible. To provide uniform coverage, such a blanket can be cut into several pieces that are positioned close to each other. In the event of a spill, however, the molten material can easily flow through gaps between the blanket pieces, and can rapidly rupture the chamber walls. Moreover, when molten silicon comes into contact with the alumina-silica blanket, the blanket is typically penetrated and soaked by the molten material. In the event of a larger spill, these blankets are generally unable to hold the molten material before it freezes completely.

In view of the disadvantages of known methods and devices, there is a need for apparatuses, systems and methods for providing a safe, cost-effective approach to prevent potential hazards caused by molten material spills in crystal growth apparatuses that have the advantages of both chemical inertness and good thermal insulating properties.

SUMMARY OF THE INVENTION

The subject invention provides apparatuses and methods for preventing molten material breach in crystal growth apparatuses. The subject invention can achieve the benefit of producing high quality crystalline products while containing and preventing serious damage caused by the occurrence of molten material spills.

According to the subject invention, a crystal growth apparatus is provided. The crystal growth apparatus comprises a chamber with a crucible provided in the chamber, the crucible configured to receive at least a charge. In particular, the charge can be silicon feedstock, or silicon feedstock with a monocrystalline silicon seed. At least one heating element is also provided for heating and at least partially melting the charge contained in the crucible. The chamber has an inner wall with an interior surface, at least a portion of which is provided with a ceramic coating for preventing molten material from leaking out through the inner wall of the chamber. The ceramic coating may be a carbide, a nitride, an oxide, a mixture of oxides, a mixed carbide, a mixed nitride, a mixture of oxides and carbides, a mixture of oxides and nitrides, a mixture of carbides and oxides, or a refractory metal and, for example, may be selected from the following materials: calcium zirconate, magnesium aluminate, zirconium oxide, magnesium zirconate, spinel, and yttira stabilized zirconium oxide. An intermediate bonding layer may also be used between the ceramic coating and the inner wall of the chamber. The chamber may further include an outer wall, and a channel arranged between the inner and outer walls. The channel may contain water or another suitable cooling medium. Also, the inner wall, the outer wall, or both the inner wall and outer wall of the chamber can be made of steel. In certain embodiments, the ceramic coating covers substantially the entire interior surface of the inner wall of the chamber. In other embodiments, the ceramic coating covers the interior surface of the inner wall that is adjacent to and below the crucible.

The crystal growth apparatus of the subject invention may further include at least one ceramic blanket layer on the ceramic coating. The crystal growth apparatus may also include a plurality of ceramic blanket layers on the ceramic coating. At least one support may also be operably connected to the chamber and provided with the ceramic coating. The crystal growth apparatus may also comprise at least one blanket layer on the support.

The subject invention also provides methods for preventing molten material breach in a crystal growth apparatus. The method preferably comprises the steps of: providing a crystal growth apparatus comprising a chamber with a crucible provided in the chamber, the crucible containing at least a charge. In particular, the charge can be silicon feedstock, or silicon feedstock with a monocrystalline silicon seed. The chamber has an inner wall with an interior surface, at least a portion of which is provided with a ceramic coating for preventing molten material from leaking out through the inner wall of the chamber. The ceramic coating may be a carbide, a nitride, an oxide, a mixture of oxides, a mixed carbide, a mixed nitride, a mixture of oxides and carbides, a mixture of oxides and nitrides, a mixture of carbides and oxides, or a refractory metal and, for example, may be selected from the following materials: calcium zirconate, magnesium aluminate, zirconium oxide, magnesium zirconate, spinel, and yttira stabilized zirconium oxide. An intermediate bonding layer may also be used between the ceramic coating and the inner wall of the chamber. The method also includes the steps of: heating and at least partially melting the charge contained in the crucible; and in the event that the molten material leaks out of the crucible, containing the leaked molten material by the ceramic coating on the inner wall of the chamber.

Like the apparatus of the subject invention, similar molten materials, coating configurations and compositions, ceramic blanket layers and supports may also be used in connection with the methods of the subject invention.

These and other aspects and advantages of the subject invention will become more readily apparent from the following description of the preferred embodiments taken in conjunction with the drawings.

BRIEF DESCRIPTION OF THE DRAWINGS

So that those skilled in the art to which the subject invention appertains will readily understand how to make and use the method and device of the subject invention without undue experimentation, preferred embodiments thereof will be described in detail herein below with reference to certain figures, wherein.

DETAILED DESCRIPTION OF THE INVENTION

Figure 1:
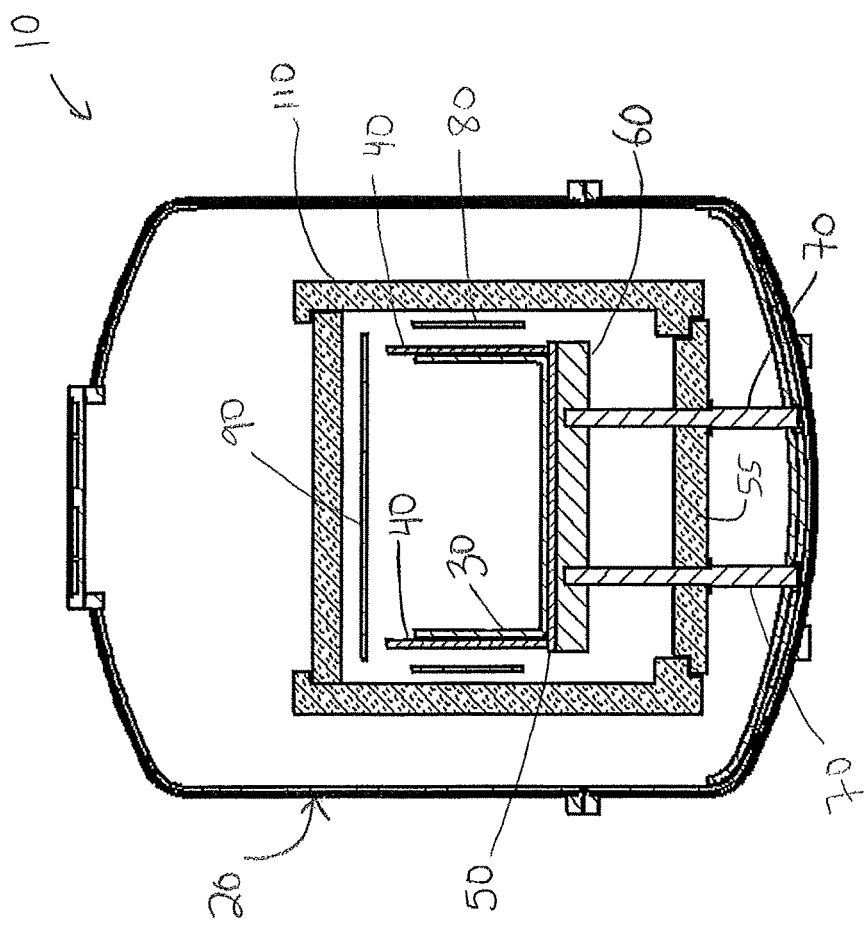
FIG. 1 is a cross-sectional schematic view of a crystal growth apparatus according to the subject invention.

Preferred embodiments of the subject invention are described below with reference to the accompanying drawings, in which like reference numerals represent the same or similar elements. While the subject invention will be described below in terms of the formation and growth of silicon, the subject invention is not limited to safety measures relating to directional solidification, the production of silicon only, nor to the exemplary operating parameters described herein.

The subject invention relates to an apparatus and method that can overcome problems associated with spills or leaks resulting during the directional solidification of a metal feedstock and provides other advantages and benefits as described herein.

While the description herein discusses crystal growth apparatuses used in the production of silicon, the systems and methods described herein are not limited to crystal growth apparatuses for the production of monocrystalline or multicrystalline silicon, or silicon only. A number of materials such as semiconductor crystals (for example, Ge, GaAs, etc.), oxides (for example, sapphire, YAG, ALON), and fluorides (for example, $MgF_2$, $CaF_2$), may also be produced using the apparatuses, systems and methods provided herein.

Figure 2:
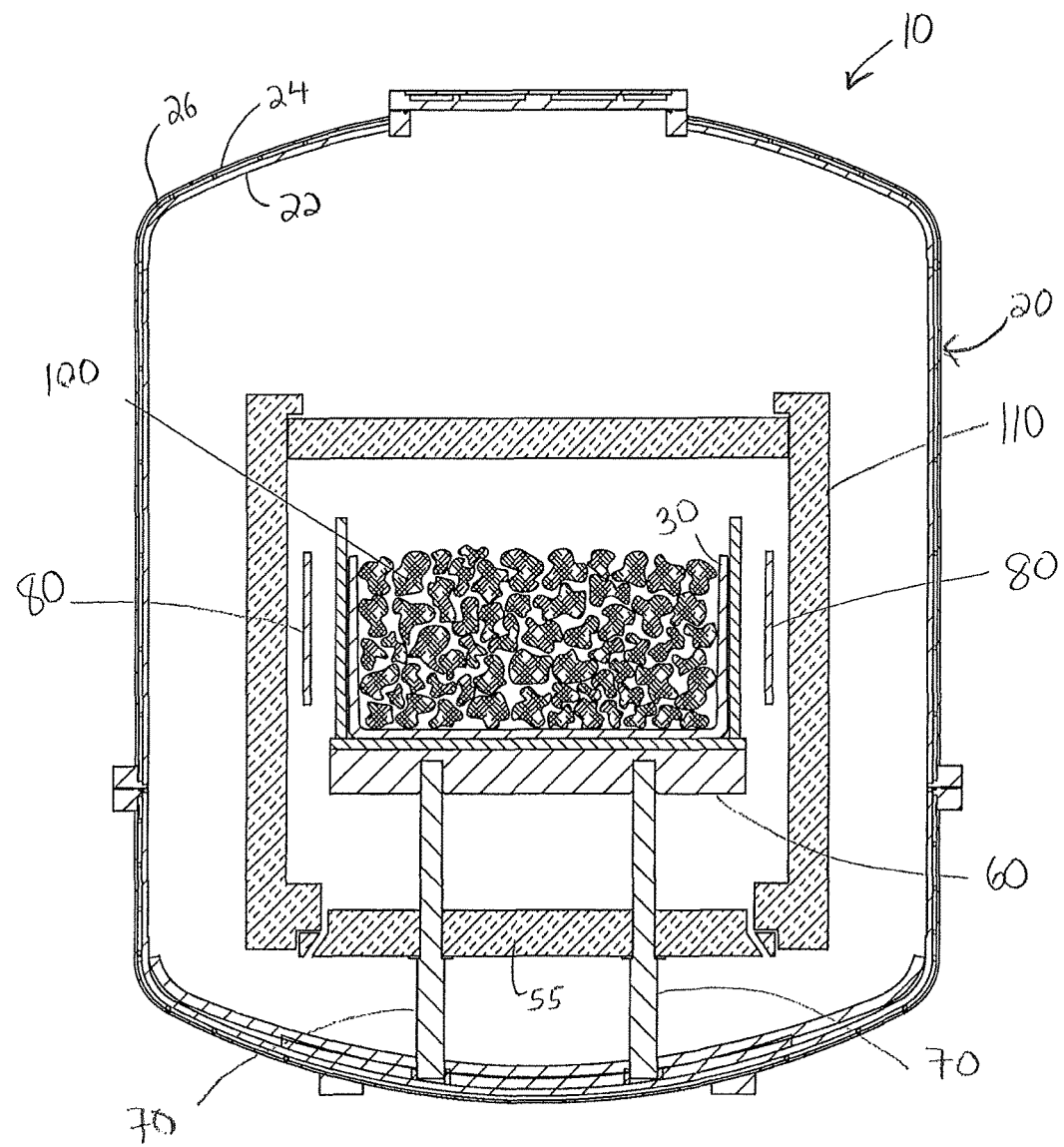
FIG. 2 is a cross-sectional schematic view of the crystal growth apparatus of FIG. 1 in which feedstock material has been added to the crucible.

Referring to FIG. 1 and FIG. 2, a cross-sectional schematic view of an exemplary embodiment of a crystal growth apparatus 10 such as a furnace according to the subject invention is shown. The crystal growth apparatus 10 incorporates a chamber 20 which preferably includes an inner wall 22, an outer wall 24, and a channel 26 formed between the inner and outer walls 22, 24. The channel 26 may preferably contain water or another suitable cooling medium. A crucible 30 is mounted within the chamber 20 for growing a crystalline ingot. The crucible 30 preferably is surrounded and supported by crucible support plates 40 along the sides of the crucible 30 and is supported underneath by a bottom crucible plate 50. Alternatively, the crucible support plates 40 and the bottom crucible plate 50 can be replaced by a crucible box formed as a single piece or multiple pieces. The crucible support plates 40, the bottom crucible plate 50, and/or the crucible box preferably are made of graphite or a suitable substitute material.

The bottom crucible plate 50 is supported on a support mechanism commonly known as a heat exchanger block 60, where the heat exchanger block is configured to conduct heat from the crucible 30 via the bottom crucible plate 50. Alternatively, the crucible 30 itself may be directly placed on the heat exchanger block 60 without the bottom crucible plate 50. The crucible 30 can be made of quartz or silica, for example, and can be provided in various shapes such as cylindrical or cubic. The heat exchanger block 60 is typically made of graphite. One or more pedestals 70 preferably are used to mount and support the crucible 30 and the heat exchanger block 60 within the chamber 20. The pedestals 70 can be made of graphite or a suitable substitute material, and are operably connected to the bottom of the chamber 20 at one end and the heat exchanger block 60 at the other end. The pedestals 70 optionally can support insulation such as bottom insulation 55 within the chamber 20.

Referring to FIG. 2, during the crystal growth process, a charge is placed within the crucible 30. For example, the charge can be silicon feedstock 100, or silicon feedstock 100 with a monocrystalline silicon seed (not shown, but commonly used for the production of monocrystalline silicon ingots). The feedstock material 100 is added to the crucible 30 and melted by an arrangement of one or more heating elements configured within the chamber 20. This may include side heating elements 80 in conjunction with a top heating element 90 (see FIG. 1), or only side heating elements 80 (see FIG. 2). Alternatively, other combinations or arrangements of heating elements may be used. A movable insulation cage 110 may be provided along the sides of the crucible 30 such that insulation can be raised and/or lowered relative to the crucible 30 to promote heat extraction and growth of the crystalline ingot. A crystal growth apparatus incorporating the use of moving insulation is described with reference to monocrystalline silicon growth in PCT International Application No. PCT/US2009/047395, which was published as WO 2010/005705 on Jan. 14, 2010, and which is incorporated by reference herein.

Figure 3:
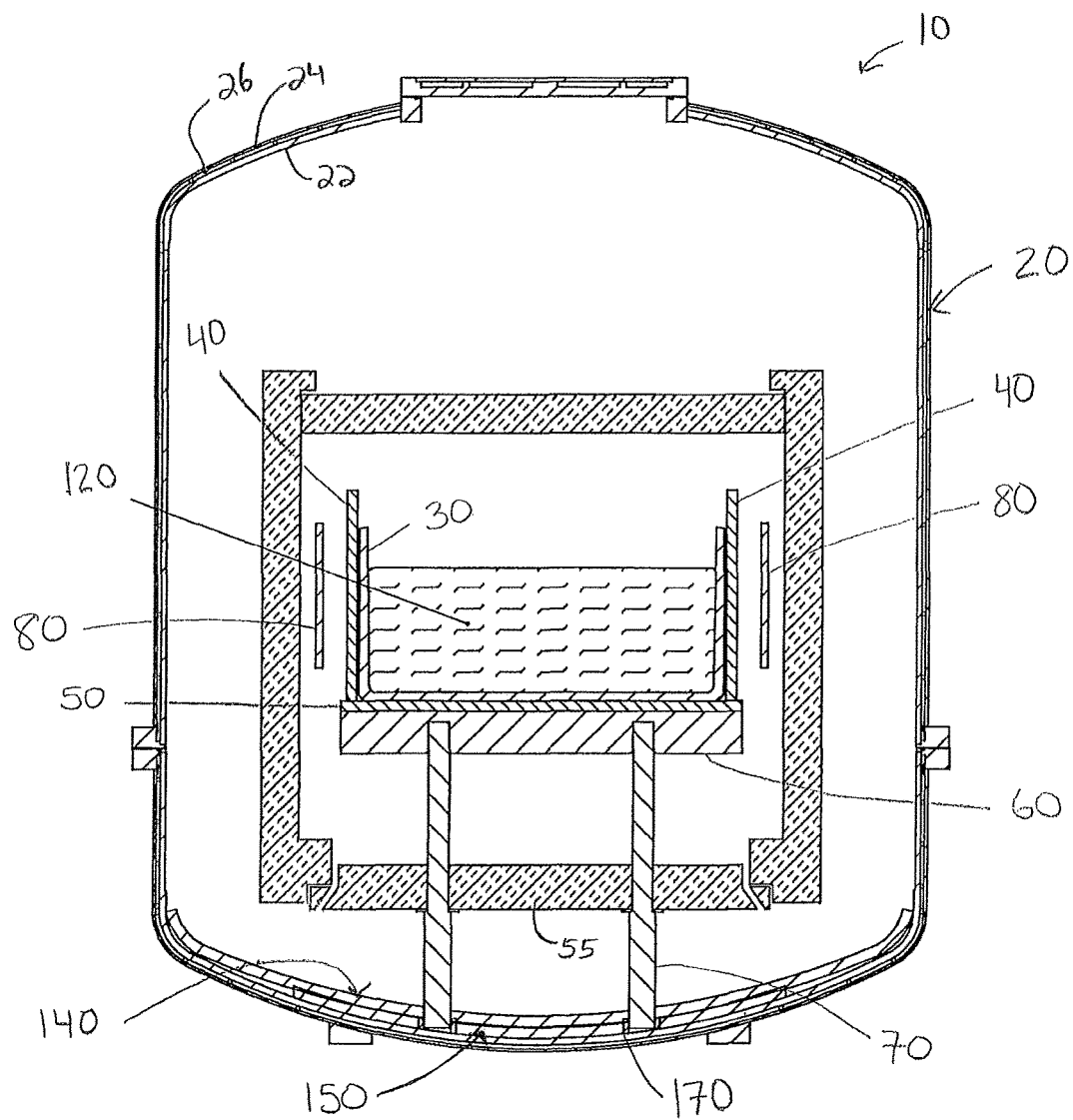
FIG. 3 is a cross-sectional schematic view of the apparatus of FIG. 1 in which the feedstock material is shown at least partially melted within the crucible.

Referring to FIG. 3, the heating elements 80 are operated so as to increase the temperature of the feedstock material 100 contained in the crucible 30 until the feedstock material 100 (and optionally, a monocrystalline silicon seed) at least partially melts, and thus becomes substantially molten material 120, which more readily reacts with other transition metals, such as iron, nickel, chromium, etc., forming a lower temperature eutectic and, depending on the composition, lowering the melting point. Because of this characteristic, molten silicon can cause serious damage when it is spilled inside of the chamber, which is typically made of steel, including stainless steel or mild steel.

Figure 4:
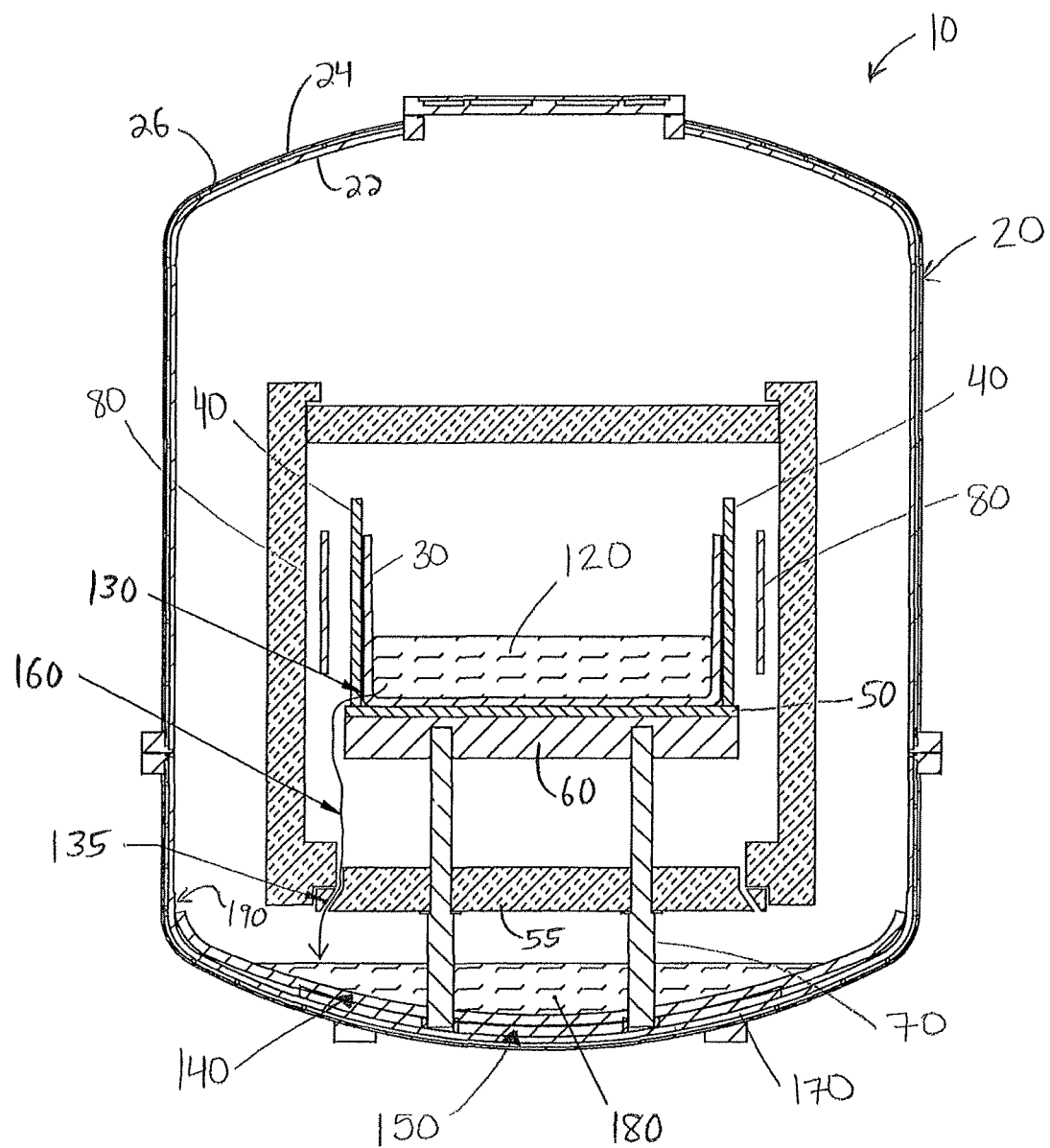
FIG. 4 is a cross-sectional schematic view of the apparatus of FIG. 1 in which an exemplary spill path of molten feedstock material is illustrated and the spilled molten material has pooled at the base of the chamber prior to breach of the inner wall of the chamber.

A typical molten material spill is illustrated in FIG. 4. In the case of spillage, at least some of the molten material 120 escapes the crucible 30, for example, by running over an edge of the crucible support plate 40 or at a spill point 130, which may be a crack or flaw in the junction of the crucible support plate 40 and the crucible bottom plate 50 or in the crucible box, if used. In the example shown, the spilled molten material may follow a spill path 160, moving beyond the heat exchanger block 60, past bottom insulation 55 at a secondary spill point 135, and coming into contact with the bottom of the chamber 20.

According to the subject invention, as shown in FIGS. 4, 5A-5B, and 6A-6B, a ceramic coating 190 is provided over at least a portion of the interior surface of the inner wall 22 of the chamber 20, so as to prevent molten silicon from breaching the inner wall 22, and thus prevent damage to the chamber 20. During the molten material 120 spill, if molten silicon, for example, solidifies and is not very reactive, the damage may be limited to replacing the damaged portions of the apparatus 10. However, if the molten material 120 reaches the steel chamber 20 surface, it can run along the dish-shaped surface of the bottom of the chamber 20 and pool in a central area at the chamber's lowest point as shown in FIG. 4. Steel has a composition which includes metals, such as, Fe, Cr, Ni, Co, etc. When silicon reacts with transition metals, it forms a lower melting temperature eutectic compared to the melting point of pure elements. For example, the melting point of silicon (Si) is 1412° C. and Fe is 1392° C. Near the silicon rich end of the phase diagram, as iron (Fe) is added to Si the melting point of the mixture decreases from 1412° C. gradually until the eutectic composition of about 0.3 mole Si/(Fe+Si) with a melting point of about 1280° C. Similar behavior exists with other transition metals and silicon.

When the pooled molten material 180 settles at the bottom area of an uncoated chamber, it begins reacting with the steel chamber 20. Using the example of Si—Fe reaction, molten silicon starts dissolving Fe slowly. As the reaction continues, the melting point is lowered and it therefore stays molten longer which keeps the reaction going for a longer time. This reaction can continue until the inner wall 22 of the chamber 20 has an opening allowing cooling medium from the channel 26, which may be water under pressure, into the chamber 20. Water can convert to steam, and a steam explosion can occur.

The subject invention provides that a ceramic coating 190 is applied to all or at least a portion of the interior surface of the inner wall 22 at the bottom of the chamber 20. The entire interior surface of the inner wall 22 may be provided with the ceramic coating 190 or, alternatively, the ceramic coating may be provided on only the lower portion of the interior surface of inner wall 22, such as the surfaces that are adjacent to and below the crucible, particularly below bottom crucible plate 50. By providing the ceramic coating 190 as described herein, damage caused by reaction of molten silicon with the chamber 20 can substantially be prevented.

Figure 5A:
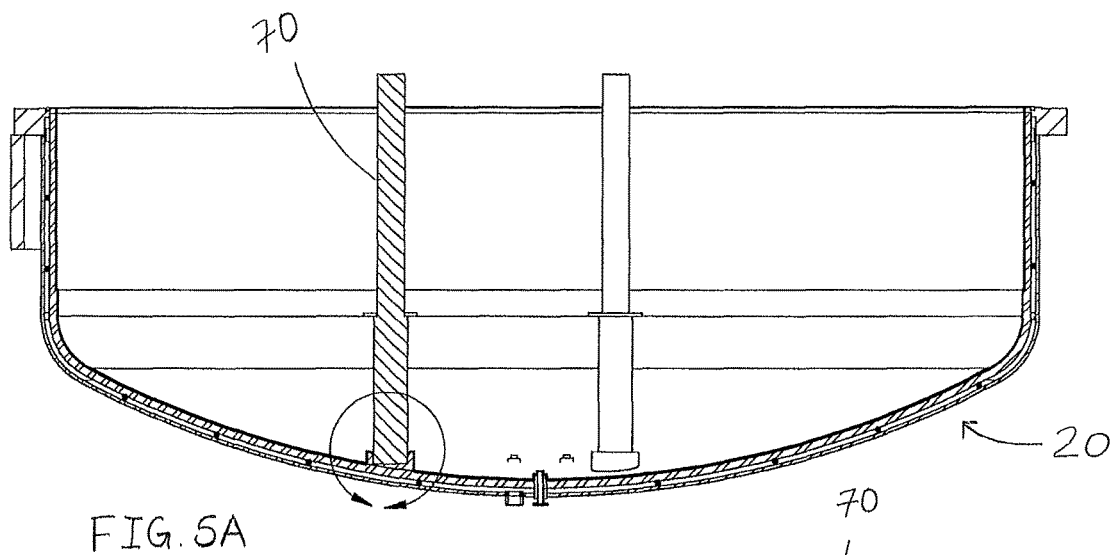
FIG. 5A is a cross-sectional schematic view of a bottom portion of a crystal growth apparatus having a ceramic coating according to the subject invention.
Figure 5B:
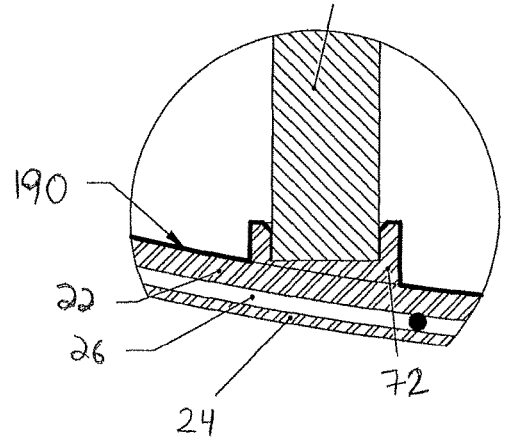
FIG. 5B is an enlarged view of the circled portion of FIG. 5A.

FIGS. 5A and 5B are views of a bottom portion of a crystal growth apparatus having the coating 190. FIG. 5B is an enlarged view of the circled portion of FIG. 5A. The coating 190 can be applied directly on a surface of the inner wall 22 of the chamber 20. The coating 190 may also be present on all or a portion of the pedestals 70 as well as pedestal mounts 72, which operate to secure the pedestals 70 within the chamber 20. The coating 190 helps to prevent breach of the inner wall 22 through to the channel 26.

The coating 190 can be selected from materials including carbides (such as, silicon carbide, boron carbide, etc.), nitrides (such as, silicon nitride), high temperature oxides (such as, alumina, yttria, zirconia, etc.), mixtures of oxides, mixed carbides, mixed nitrides, mixtures of oxides and carbides, mixture of oxides and nitrides, mixtures of carbides and oxides, and refractory metals (such as tungsten, molybdenum, tantalum, etc.). For example, the ceramic coating may be a material selected from the group consisting of: calcium zirconate, magnesium aluminate, zirconium oxide, magnesium zirconate, spinel, and yttira stabilized zirconium oxide. Because some of these coating materials have high porosity, it may be helpful to combine one or more of these materials in order to fill the pores. For example, silicon carbide in a porous form can be made more effective after coating with silicon nitride. With this approach, cheaper silicon carbide can be substituted for more expensive silicon nitride.

The specifications of the coating 190 applied depend on the density of the coating 190 as well as the application process. For example, dense coatings can be applied by processes, such as, plasma spraying, CVD, etc. In such cases, for non-wetting coatings, thicknesses of about 2-10 mm are typically sufficient. However, ceramic processes, such as grouting, result in more porous layers. As a result, thicknesses of about 20-50 mm may be necessary for these applications. In the event that a combination of porous coatings is used, a non-wetting thin layer coating may be applied. In addition, the coating may be preformed, such as tiles, and then attached or applied to the inner wall surface of the chamber. The coating 190 applied to the bottom of the chamber 20 provides an impervious layer between the pooled molten material 180 and the steel inner chamber wall 22 so that the water channel 26 cannot be accessed and steam explosions are prevented. The coating 190 may be applied as one layer of a desired thickness. Alternatively, several layers of uniform or varying thicknesses may be used. In addition, multiple layers of different coating materials may be used in combination in order to achieve a desired coating profile characteristic. Furthermore, it may be necessary or preferable to make use of an intermediate layer to improve the adhesion or bonding of the ceramic coating to the chamber inner wall. Examples of intermediate layers include metal alloys such as a nickel-chromium alloy bond coat.

Figure 6A:
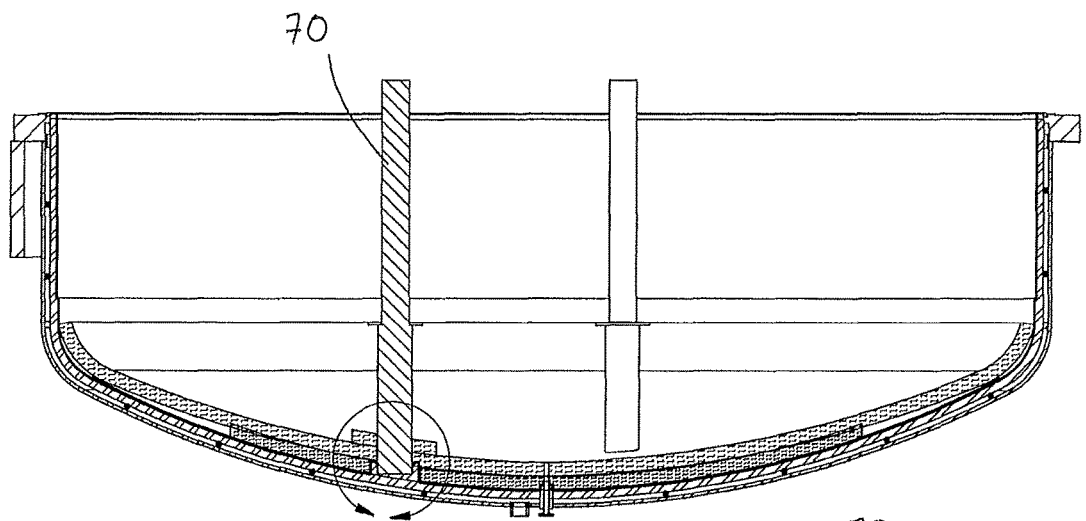
FIG. 6A is a cross-sectional schematic view of a bottom portion of a crystal growth apparatus having a ceramic coating and a ceramic blanket with two insulation layers according to the subject invention.
Figure 6B:
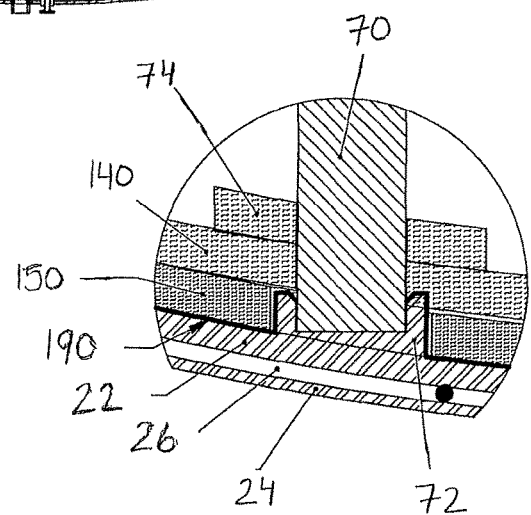
FIG. 6B is an enlarged view of the circled portion of FIG. 6A.

In addition, as shown in FIGS. 4 and 6A-6B, one or more insulation layers of a ceramic blanket may be used. Two exemplary insulation layers are shown: an upper insulation layer 140 and a lower insulation layer 150, although additional layers may also be included. It is desirable that the material of the ceramic blanket have a melting point higher than the melting point of the molten material, be non-wetting and minimally reactive with the molten material, and/or not form a lower melting product on reaction with the molten material and/or a gaseous product on reaction with the molten material. The insulation layers 140, 150 optionally cover the bottom of the chamber 20 in order to reduce the possibility of the molten material 120 reaching the interior surface of inner wall 22 at the bottom of the chamber 20. Preferably, the ceramic blanket covers substantially an entire bottom surface of the chamber 20, such that it offers a first level of spill resistance by promoting solidification of silicon before it reacts to form a eutectic.

FIGS. 6A and 6B illustrate the coating 190 of the subject invention in conjunction with a ceramic blanket. The ceramic blanket provides additional layers of spill protection. In one embodiment, the ceramic blanket is comprised of two layers, the upper insulation layer 140 and the lower insulation layer 150, as shown in FIGS. 6A and 6B, however one or more additional layers of insulation may be used. FIG. 6B is an enlarged view of the circled portion of FIG. 6A. In FIG. 6B, the insulation layers 140 and 150 are provided adjacent to each other at the bottom of the chamber 20 directly on top of the coating 190. FIGS. 6A and 6B also illustrate an optional ceramic ring 74 which may be provided on top of the ceramic blanket, adjacent to the upper insulation layer 140 for increased protection of the pedestal 70. For illustrative purposes only, one pedestal 70 is illustrated with the coating 190 and ceramic blanket configurations. However, one or more pedestals 70 may be provided within the chamber 20 and may include the features described above with respect to FIGS. 5A-6B.

An optional spill wire detection system (not shown) may also be placed on top of the ceramic blanket directly under the crucible 30, which would be configured to break a circuit when the molten material 120 reacts with the wire, and thus serve as a warning for molten material 120 spill detection, allowing the system to be shut down to prevent further damage. However, larger spills occurring over a short period of time may flood the bottom of the chamber before the system can be shut down, and thus can overwhelm this detection system. Furthermore, ceramic blankets covering the bottom chamber 20 can degrade over time. The apparatus 10 of the subject invention provides that the coating 190 is applied to all or at least a portion of the inner wall 22 at the bottom of the chamber 20. Therefore, by providing the ceramic coating 190 as described herein, damage caused by reaction of molten silicon with the chamber 20 can substantially be prevented.

Because silicon in the molten state is very reactive, it may be advantageous to solidify it in the event of a spill. Therefore, if materials are put in the molten silicon path that take heat away from the molten silicon, it would be helpful to slow the reaction. For example, pieces of solid silicon and/or high temperature non-reactive materials can be used. In addition, in conjunction with the coating 190, the inner wall 22 at the bottom of the chamber 20 can be lined with highly conductivity materials (not shown), such as copper which would be capable of chilling the molten silicon and solidifying it. Alternatively, a material can be fixed to the bottom of the chamber 20 to which the coating 190 has been applied. This material can be provided above the inner wall 22 and beneath the ceramic blanket.

Although the subject invention has been described with respect to preferred embodiments, those skilled in the art will readily appreciated that changes or alterations in the sequences described or modifications thereto may be made without departing from the spirit or scope of the subject invention as defined by the appended claims.

INCORPORATION BY REFERENCE

The entire contents of all patents, published patent applications and other references cited herein are hereby expressly incorporated herein in their entireties by reference.

What is claimed is:

1. A directional solidification apparatus, comprising:
   a chamber;
   a crucible provided in the chamber, the crucible configured to receive at least a charge; and
   at least one heating element for heating and at least partially melting the charge contained in the crucible to form a molten material,
   wherein the chamber has an inner wall with an interior surface, and the interior surface that is adjacent to and below the crucible is coated with a ceramic coating for preventing the molten material from leaking out through the inner wall of the chamber.

2. The directional solidification apparatus of claim 1, wherein the chamber further comprises an outer wall, and a channel formed between the inner and outer walls.

3. The directional solidification apparatus of claim 2, wherein the channel contains a cooling medium.

4. The directional solidification apparatus of claim 3, wherein the cooling medium is water.

5. The directional solidification apparatus of claim 2, wherein the inner wall, the outer wall, or both the inner and outer walls are made of steel.

6. The directional solidification apparatus of claim 1, wherein the ceramic coating covers substantially the entire interior surface of the inner wall of the chamber.

7. The directional solidification apparatus of claim 1, wherein the ceramic coating covers all of the interior surface of the inner wall that is adjacent to and below the crucible.

8. The directional solidification apparatus of claim 1, further comprising an intermediate bonding layer between the ceramic coating and the interior surface of the inner wall of the chamber.

9. The directional solidification apparatus of claim 1, further comprising at least one ceramic blanket layer on the ceramic coating.

10. The directional solidification apparatus of claim 1, further comprising a plurality of ceramic blanket layers on the ceramic coating.

11. The directional solidification apparatus of claim 1, wherein the ceramic coating is a carbide, a nitride, an oxide, a mixture of oxides, a mixed carbide, a mixed nitride, a mixture of oxides and carbides, a mixture of oxides and nitrides, a mixture of carbides and oxides, or a refractory metal.

12. The directional solidification apparatus of claim 11, wherein the ceramic coating is selected from the group consisting of: calcium zirconate, magnesium aluminate, zirconium oxide, magnesium zirconate, spinel, and yttira stabilized zirconium oxide.

13. The directional solidification apparatus of claim 1, wherein the charge comprises a silicon feedstock or a silicon feedstock with a mono crystalline silicon seed.

14. The directional solidification apparatus of claim 1, further comprising at least one support operably connected to the chamber, the support covered with the ceramic coating.

15. The directional solidification apparatus of claim 14, further comprising at least one blanket layer on the support.

16. A method for preventing molten material breach in a crystal growth apparatus, comprising the steps of:
   providing a directional solidification apparatus comprising a chamber with a crucible provided within the chamber, the crucible containing at least a charge, wherein the chamber has an inner wall with an interior surface, and the interior surface that is adjacent to and below the crucible is coated with a ceramic coating;

heating and at least partially melting the charge contained in the crucible to form a molten material; and in the event that the molten material leaks out of the crucible, containing the leaked molten material by the ceramic coating on the interior surface of the inner wall of the chamber.

17. The method of claim 16, wherein the ceramic coating covers substantially the entire interior surface of the inner wall of the chamber.

18. The method of claim 16, wherein the ceramic coating covers all of the interior surface of the inner wall that is adjacent to and below the crucible.

19. The method of claim 16, further comprising an intermediate bonding layer between the ceramic coating and the interior surface of the inner wall of the chamber.

20. The method of claim 16, further comprising at least one ceramic blanket layer on the ceramic coating.

21. The method of claim 16, further comprising at least one support operably connected to the chamber, the support covered with the ceramic coating.

* * * * *